United States Patent

Finn

(10) Patent No.: US 10,291,228 B1
(45) Date of Patent: May 14, 2019

(54) CURRENT MODE LOGIC DRIVER WITH LEVEL SHIFTER

(71) Applicant: TEXAS INSTRUMENTS INCORPORATED, Dallas, TX (US)

(72) Inventor: Steven Ernest Finn, Chamblee, GA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/973,766

(22) Filed: May 8, 2018

(51) Int. Cl.
*H03K 19/0175* (2006.01)
*H03K 19/0185* (2006.01)
*H03F 3/60* (2006.01)
*H03K 19/00* (2006.01)

(52) U.S. Cl.
CPC ..... *H03K 19/018507* (2013.01); *H03F 3/605* (2013.01); *H03K 19/0005* (2013.01)

(58) Field of Classification Search
CPC ............. H03F 3/605; H03K 19/0005; H03K 19/018507
See application file for complete search history.

(56) References Cited

U.S. PATENT DOCUMENTS

| 7,646,256 B2* | 1/2010 | Moloudi | H03C 3/0975 331/117 FE |
| 9,674,015 B2* | 6/2017 | Kireev | H04L 25/4919 |
| 2010/0259300 A1* | 10/2010 | Aziz | H03K 19/01758 326/82 |

* cited by examiner

*Primary Examiner* — Alexander H Taningco
*Assistant Examiner* — Kurtis S Bahr
(74) *Attorney, Agent, or Firm* — John R. Pessetto; Charles A. Brill; Frank D. Cimino

(57) ABSTRACT

A driver circuit includes a first termination resistor and a distributed amplifier comprising a plurality of pairs of input transistors and comprising inductors coupled between each pair of input transistors. The driver circuit also includes a distributed current-mode level shifter coupled to the first termination resistor. The distributed current-mode level shifter includes a first plurality of inductors coupled in series between the first termination resistor and the distributed amplifier and a first plurality of capacitive devices. Each capacitive device is coupled to a power supply node and to a node interconnecting two of the series-coupled inductors.

12 Claims, 2 Drawing Sheets

CURRENT MODE LOGIC DRIVER WITH LEVEL SHIFTER

BACKGROUND

A current-mode level driver is a circuit that receives a time-varying input signal having one current-mode voltage level and produces an output signal with the same or similar time-varying component but at a different current-mode voltage level. For example, the current-mode voltage level of the output signal from the driver may be a higher voltage level than the current-mode voltage level of the input signal.

SUMMARY

In one example, a driver circuit includes a first input transistor including a first control input coupled to receive a first input signal and including a first current terminal and a second current terminal, and a second input transistor including a second control input coupled to receive a second input signal and including a third current terminal and a fourth current terminal, the fourth current terminal coupled to the second current terminal at a first node. The driver circuit further includes a current source device coupled to the first node and to a first power supply node, a first resistive device coupled to a second power supply node and a second resistive device coupled to the second power supply node. A first plurality of current source segments is included as well. Each current source segment includes a first inductive component coupled between the first current terminal at a second node and the first resistor, and each current source segment also includes a third transistor having fifth and sixth current terminals, the fifth current terminal being coupled to the second power supply node, and the first inductive component is connected to the sixth current terminal. A second plurality of current source segments is also included. Each current source segment of the second plurality of current source segments includes a second inductive component coupled between the third current terminal at a third node and the second resistor, and each current source segment of the second plurality of current source segments also includes a fourth transistor having seventh and eighth current terminals, the seventh current terminal of each of the second plurality of current source segments is coupled to the second power supply node, and the second inductive component is connected to the eighth current terminal.

In another example, a driver circuit includes a first termination resistor and a distributed amplifier comprising a plurality of pairs of input transistors and comprising inductors coupled between each pair of input transistors. The driver circuit also includes a distributed current-mode level shifter coupled to the first termination resistor. The distributed current-mode level shifter includes a first plurality of inductors coupled in series between the first termination resistor and the distributed amplifier and a first plurality of capacitive devices. Each capacitive device is coupled to a power supply node and to a node interconnecting two of the series-coupled inductors.

In yet another example, a driver circuit includes a first input transistor including a first control input coupled to receive a first input signal and including a first current terminal and a second current terminal and a second input transistor including a second control input coupled to receive a second input signal and including a third current terminal and a fourth current terminal, the fourth current terminal coupled to the second current terminal at a first node. The driver circuit in this example also includes a current source device coupled to the first node and to a first power supply node and a first resistor coupled to a second power supply node. A first plurality of current source segments is also included. Each current source segment includes a first inductor coupled between the first current terminal at a second node and the first resistor. Each current source segment also includes a third transistor having fifth and sixth current terminals, the fifth current terminal coupled to the second power supply node, and the first inductor connected to the sixth current terminal.

BRIEF DESCRIPTION OF THE DRAWINGS

For a detailed description of various examples, reference will now be made to the accompanying drawings in which.

DETAILED DESCRIPTION

At least some current-mode logic (CML) drivers are limited as to the how large the output current-mode voltage level can be when the termination at the load being driven by the driver is not direct current (DC)-coupled to a power supply. For some applications, such as optical drivers requiring large voltage swings of their input signals, a bias-T circuit can be included to raise the output current-mode voltage level. However, for some applications, DC biasing is required and headroom limitations from the driver's transistors limits the maximum output voltage swing.

The disclosed example CML driver includes a distributed current-mode level shifter coupled to an amplifier, which may be implemented as a distributed amplifier. The disclosed CML driver provides for increased output voltage amplitude, for a given power supply voltage, as the headroom limitations noted above are eliminated or reduced. Further, the disclosed driver provides for increased output voltage levels without increasing the power consumption of the driver.

Figure 1:
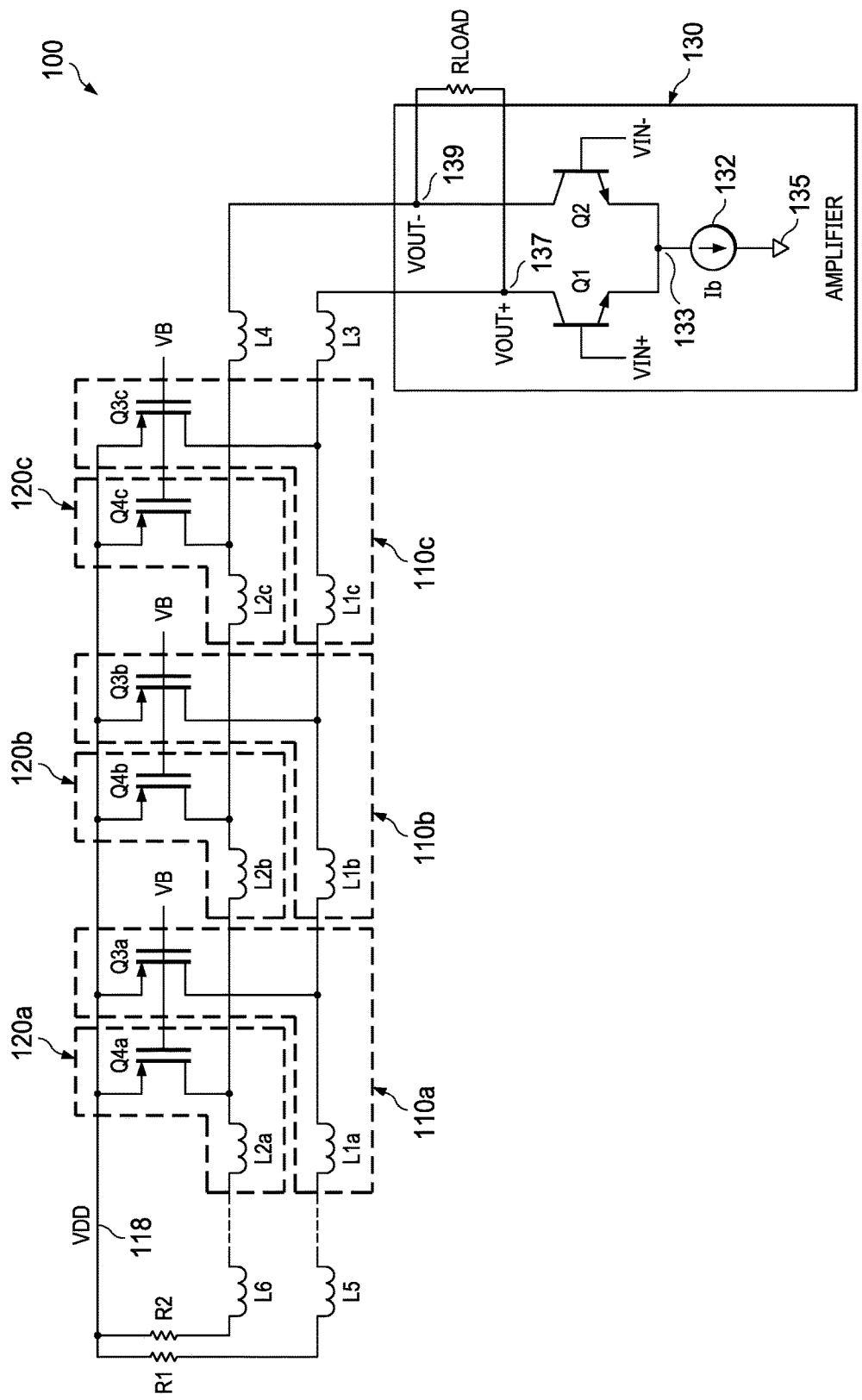
FIG. 1 illustrates a current-mode level driver in accordance with an example.

FIG. 1 shows an example implementation of a CML driver 100. CML driver 100 includes termination resistors R1 and R2, a distributed current-mode level shifter comprising two sets of current source segments, and an amplifier 130. One set of current source segments comprises current source segments 110a, 110b, and 110c (collectively current source segments 110) and another set of current source segments comprises current source segments 120a, 120b, and 120c (collectively current source segments 120) and an amplifier 130. The time-varying input signal to the CML driver 100 is shown as VIN+ and VIN−, and the output signal form the CML driver is shown as VOUT+ and VOUT−. VOUT+ is the signal on the source of Q1 at node 137 and VOUT− is the signal on the source of Q2 at node 139. RLOAD represents the resistance of a load being driven by driver 100.

In this example, the amplifier 130 includes input transistors Q1 and Q2 and a current source device 132. Each transistor Q1 and Q2 includes a control input and a pair of current terminals. In the example of FIGS. 1, Q1 and Q2 are implemented as bipolar junction transistors (BSI's) and specifically n-type BJTs. As such, the control input and current terminals of each transistor are the base, collector, and emitter, respectively. In other examples, the input transistors may be implemented as p-type BJTs or as metal oxide semiconductor field effect transistors (MOSFETS). As MOSFETS, the input transistors may be implemented as either n-type MOSFETS (NMOS devices) or p-type MOSFETS (PMOS devices).

The VIN+ input signal is provided to the base of Q1 and the VIN− input signal is provided to the base of Q2. The input signal, represented as VIN+ and VIN−, is a time-varying signal with VIN+ and VIN− being reciprocally related. That is, as VIN+ increases, VIN− decreases, and vice versa. The VIN+ and VIN− signals vary with respect to time about a current-mode voltage level. The emitters of Q1 and Q2 are connected together as shown at node 133. The current source device 132 (which may be implemented as one or more transistors) also is connected to node 133 and thus to the emitters of Q1 and Q2. The current source device 132 also is connected to a power supply node 135 (e.g., ground). The magnitude of the current that flows through the current source device 132 is Ib and as the current paths through Q1 and Q2 are joined at node 133, the sum of the current through Q1 and Q2 is Ib.

Each current source segment 110, 120 includes a capacitive device and an inductive device. In the example of FIG. 1, the capacitive device is a transistor and the inductive device is an inductor. The transistors in the current source segments 110, 120 are PMOS devices in this example, but can be other than PMOS devices in other examples (e.g., NMOS devices, n-type BJTs, p-type BJTs, etc.). Current source segment 110a includes transistor Q3a and inductor L1a. Current source segment 110b includes transistor Q3b and inductor L1b. Current source segment 110c includes transistor Q3c and inductor L1c. Current source segment 120a includes transistor Q4a and inductor L2a. Current source segment 120b includes transistor Q4b and inductor L2b. Current source segment 120c includes transistor Q4c and inductor L2c. Transistors Q3a, Q3b, Q3c of current source segments 110 are referred to herein as transistors Q3 Similarly, transistors Q4a, Q4b, Q4c of current source segments 130 are referred to herein as transistors Q4. While three current source segments 110 and three current source segments 120 are shown in the implementation of FIG. 1, a different number of current source segment is possible in other implementations. For example, current source segments 110 may include four, five or more current source segments. Similarly, current source segments 120 may include four, five or more current source segments.

The termination resistors R1 and R2 are coupled to a power supply node 118 (e.g., VDD). A series connection of inductors is connected between termination resistor R1 and node 137. The series connection of inductors includes the inductors L1a, L1b, and L1c (collectively inductors L1) of the current source segments 110 as well as inductors L3 and L5. As such, the inductor L1 of each current source segment 110 is coupled between (although not necessarily directly connected to) the source of Q1 at node 137 and termination resistor R1. The source of each of transistors Q3 of the current source segments 110 are coupled to the power supply node 118, and the drain of each of the transistors Q3 is connected to the corresponding inductor L1. The gates of Q3 are biased to a voltage designated as VB.

The architecture of the current source segments 120 is similar to that of current source segments 110. A series connection of inductors is connected between termination resistor R2 and node 139. The series connection of inductors includes the inductors L2a, L2b, and L2c (collectively inductors L2) of the current source segments 120 as well as inductors L4 and L6. The inductor L2 of each current source segment 120 is coupled between (although not necessarily directly connected to) the source of Q2 at node 139 and termination resistor R2. The source of each of transistors Q4 of the current source segments 120 are coupled to the power supply node 118, and the drain of each of the transistors Q4 is connected to the corresponding inductor L2. The gates of Q4 are biased to a voltage designated as VB.

In one example, each of inductors L1 has an inductance that is twice the inductance of inductor L3 and L5. That is, the inductance of L3 is approximately the same as the inductance of L5, and the inductance of each of L1a, L1b, and L1c is double the inductance of L3 or L5. Similarly, each of inductors L2 has an inductance that is twice the inductance of inductor L4 and L6. That is, the inductance of L4 is approximately the same as the inductance of L6, and the inductance of each of L2a, L2b, and L2c is double the inductance of L4 or L6. Although the values of the inductances are application-specific, in one example, the inductance of each of L3-L6 is 175 pico-Henries (pH) and the inductance of each of L1 and L2 is 350 pH.

The drain of each transistor Q3 and Q4 connects to a node between a pair of corresponding series-connected inductors L1 and L2 as shown. The inductor L1 and L2 connected between drains of transistors Q3 and Q4 may be implemented as one inductor or as multiple inductors. As shown in FIG. 1, each current source segment 110, 120 includes one inductor L1, L2.

Figure 2:
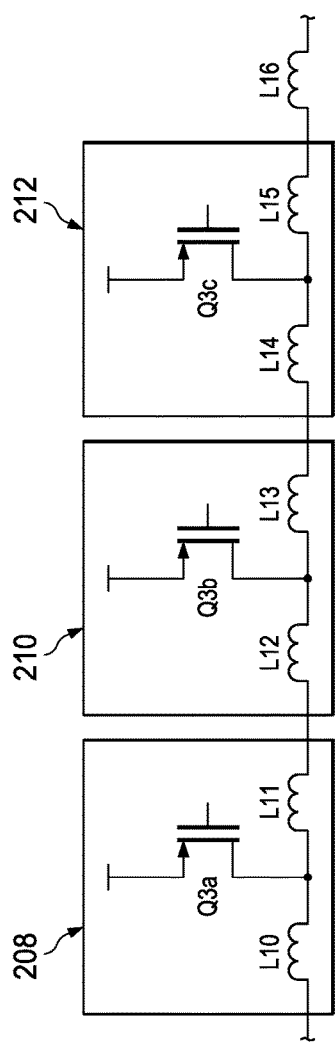
FIG. 2 shows an example of current source segments usable in the current-mode level driver.

FIG. 2 shows a portion of the driver 100 of FIG. 1. Along the series-connection of inductors (show in FIG. 2 as inductors L10, L11, L12, L13, L14, L15, and L16) connected between R1 and node 137 (VOUT+), the drain of each transistor Q3a-c is separated from the drain of the adjacent transistor by two inductors. For example, the drain of Q3b is separated from the drain of Q3a by inductors L11 and L12. Similarly, the drain of Q3b is separated from the drain of Q3c by inductors L13 and L14. The current source segment including transistor Q3b is identified by reference numeral 210 and include Q3b and inductors L12 and L13. Similarly, transistor Q3a is part of a current source segment that includes L10 and L11, and transistor Q3c is part of a current source segment that includes L14 and L15. A similar configuration is true as well for the transistors Q4a-Q4c connected to the series-connection of inductors between R2 and node 139 (VOUT−).

The current source segments 120, 130, 208-212 function to inject current into the output nodes 137, 139 to increase the current-mode voltage level of the output. However, by using multiple current source segments and thus dividing the current through multiple smaller transistors, a large capacitance is not connected directly to the output nodes 137, 139 of the driver. The larger the capacitance is that is connected to the output nodes, the lower will be the bandwidth of the driver. Each transistor Q3, Q4 shown in in FIG. 1 represents a relatively small capacitance separated by adjoining inductors. As a result of this architecture, the bandwidth of the driver is higher than would be the case if one large transistors was used instead of multiple smaller transistors. Further, the distributed current-mode shifter comprising the various current source segments 110, 120 approximately matches the impedance of the termination resistors R1 and R2 and to RLOAD.

Figure 3:
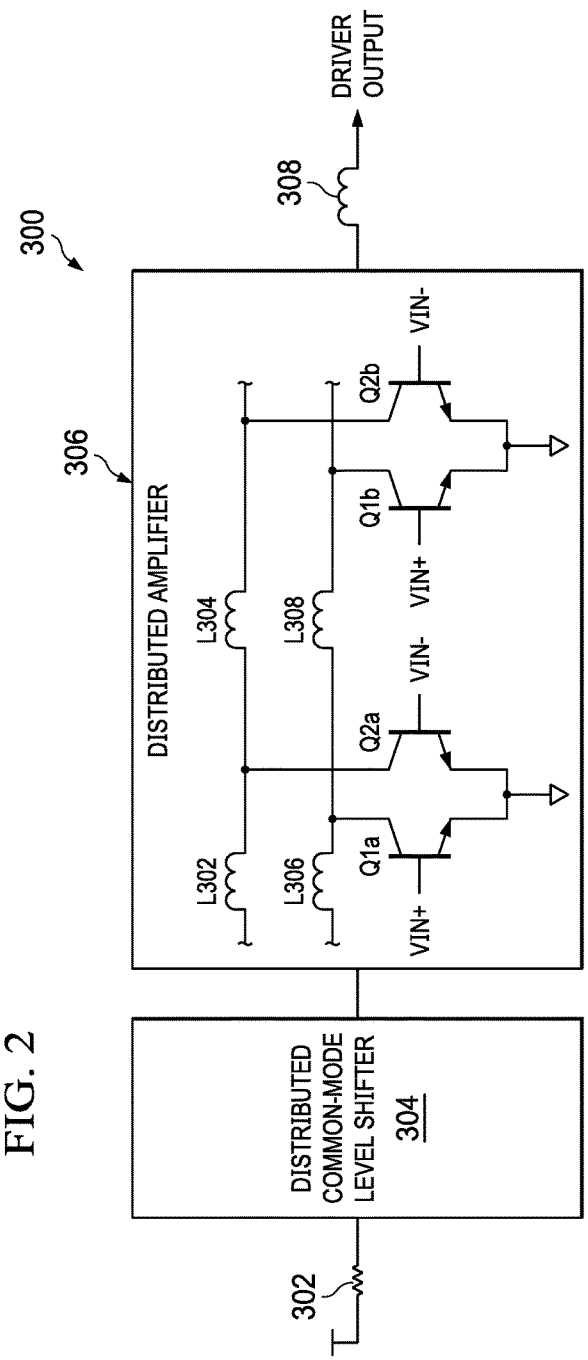
FIG. 3 illustrates a current-mode level driver in accordance with another example.

FIG. 3 shows an example of a CML driver 300, similar to that of CML driver 100 of FIG. 1. In FIG. 3, the CML driver 300 is shown schematically as a termination resistor 302 (e.g., resistor R1 and/or R2), a distributed current-mode level shifter 304, a distributed amplifier 306, an inductance 308. Inductance 308 represents the inductance of the bond wire(s) to which the semiconductor die comprising the CML driver 300 connects to other components on a circuit board (e.g., the load to be driven by the CML driver). In some examples, the distributed current-mode level shifter 304 is implemented as is shown in FIG. 1 or 2.

Rather than a single pair of input transistors Q1 and Q2 as in FIG. 1, the distributed amplifier 306 of the example of FIG. 3 includes multiple pairs of input transistors. Two pairs of input transistors are shown in FIG. 3, although more than two pairs are possible in other examples. One pair of input transistors in FIG. 3 comprises Q1a and Q2a, and the other pair includes transistors Q1b and Q2b. The transistors Q1a, Q1b, Q2a, and Q2b in FIG. 3 comprise n-type BJTs but can include other types of transistors such as p-type BJTs, NMOS transistors, or PMOS transistors in other examples. One or more inductors such as inductor L308 are coupled between the sources of Q1a and Q1b. Similarly, one or more inductors such as inductor L304 are coupled between the sources of Q2a and Q2b. Inductors L302 and L306 may be inductors L3 and L3 (FIG. 1) or may be additional inductors included as part of the distributed amplifier 306.

The benefit of the distributed amplifier 306 as opposed to a single input transistor pair is similar to that of the distributed current-mode level shifter comprising the multiple current-source segments 110, 120. Specifically, by using more (and smaller) input transistors, the capacitance introduced by each input transistor is smaller than would have been the case if a single input transistor pair was used (for the same current level). As a result, the bandwidth of the CML driver 300 is greater than would have been possible if a single input transistor pair was used.

In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The term "approximately" means equal to or within a range of plus or minus 10%.

The above discussion is meant to be illustrative of various examples. Numerous variations and modifications will become apparent to those skilled in the art once the above disclosure is fully appreciated. It is intended that the following claims be interpreted to embrace all such variations and modifications.

What is claimed is:

1. A driver circuit, comprising:
   a first input transistor including a first control input coupled to receive a first input signal and including a first current terminal and a second current terminal;
   a second input transistor including a second control input coupled to receive a second input signal and including a third current terminal and a fourth current terminal, the fourth current terminal coupled to the second current terminal at a first node;
   a current source device coupled to the first node and to a first power supply node;
   a first resistive device coupled to a second power supply node;
   a second resistive device coupled to the second power supply node;
   a first plurality of current source segments, each current source segment comprising a first inductive component coupled between the first current terminal at a second node and the first resistor, and each current source segment also including a third transistor having fifth and sixth current terminals, the fifth current terminal coupled to the second power supply node, and the first inductive component connected to the sixth current terminal; and
   a second plurality of current source segments, each current source segment of the second plurality of current source segments comprising a second inductive component coupled between the third current terminal at a third node and the second resistor, and each current source segment of the second plurality of current source segments also including a fourth transistor having seventh and eighth current terminals, the seventh current terminal of each of the second plurality of current source segments coupled to the second power supply node, and the second inductive component connected to the eighth current terminal.

2. The driver circuit of claim 1, wherein the first plurality of current source segments includes at least three current source segments and the second plurality of current source segments also includes at least three current source segments.

3. The driver circuit of claim 1, wherein the third and fourth transistors comprise metal oxide semiconductor field effect transistors.

4. The driver circuit of claim 3, wherein the first and second transistors comprise bipolar junction transistors.

5. The driver circuit claim 1, wherein the impedance of the first and second pluralities of current source segments approximately matches the resistance of the first and second resistive devices.

6. The driver circuit of claim 1, wherein the first and second input signals comprise time-varying signals and have a current mode signal level, and output signals from the second and third nodes have a current mode signal level that is different than the current signal level of the first and second input signals.

7. The driver circuit of claim 1, wherein the first inductive components of the first plurality of current source segments are coupled in series between the second node and the first resistor.

8. The driver circuit of claim 7, wherein the second inductive components of the second plurality of current source segments are coupled in series between the third node and the second resistor.

9. A driver circuit, comprising:
   a first input transistor including a first control input coupled to receive a first input signal and including a first current terminal and a second current terminal;
   a second input transistor including a second control input coupled to receive a second input signal and including a third current terminal and a fourth current terminal, the fourth current terminal coupled to the second current terminal at a first node;
   a current source device coupled to the first node and to a first power supply node;
   a first resistor coupled to a second power supply node; and
   a first plurality of current source segments, each current source segment comprising a first inductor coupled between the first current terminal at a second node and the first resistor, and each current source segment also including a third transistor having fifth and sixth current terminals, the fifth current terminal coupled to the second power supply node, and the first inductor connected to the sixth current terminal.

10. The driver circuit of claim 9, further including:
a second resistor device coupled to the second power supply node; and
a second plurality of current source segments, each current source segment of the second plurality of current source segments comprising a second inductor component coupled between the third current terminal at a third node and the second resistor, and each current source segment of the second plurality of current source segments also including a fourth transistor having seventh and eighth current terminals, the seventh current terminal of each of the second plurality of current source segments coupled to the second power supply node, and the second inductor component connected to the eighth current terminal.

11. The driver circuit of claim 10, wherein the impedance of the first and second pluralities of current source segments approximately matches the resistance of the first and second resistors.

12. The driver circuit of claim 9, wherein the first plurality of current source segments comprises five current source segments.

* * * * *